United States Patent
Lee et al.

(10) Patent No.: US 7,957,250 B2
(45) Date of Patent: Jun. 7, 2011

(54) OPTICAL HEAD

(75) Inventors: Chih-Kung Lee, Taipei (TW);
Ding-Zheng Lin, Taipei (TW);
Tsung-Dar Cheng, Taipei (TW);
Chin-Kai Chang, Tainan (TW);
Chih-Hao Chen, Taichung County (TW); Chau-Shioung Yeh, Taipei (TW);
You-Chia Chang, Taichung (TW)

(73) Assignees: Industrial Technology Research Institute, Hsinchu (TW); National Taiwan University, Taipei (TW)

( * ) Notice: Subject to any disclaimer, the term of this patent is extended or adjusted under 35 U.S.C. 154(b) by 585 days.

(21) Appl. No.: 11/960,725

(22) Filed: Dec. 20, 2007

(65) Prior Publication Data
US 2008/0304397 A1 Dec. 11, 2008

(30) Foreign Application Priority Data
Jun. 8, 2007 (TW) .............................. 96120707 A

(51) Int. Cl.
*G11B 7/00* (2006.01)
(52) U.S. Cl. ................................. 369/112.27
(58) Field of Classification Search .............. None
See application file for complete search history.

(56) References Cited

U.S. PATENT DOCUMENTS

| | | | |
|---|---|---|---|
| 5,517,280 A * | 5/1996 | Quate | 355/71 |
| 7,057,151 B2 * | 6/2006 | Lezec et al. | 250/216 |
| 2004/0131001 A1 * | 7/2004 | Nakada et al. | 369/112.27 |
| 2006/0018211 A1 | 1/2006 | Ueyanagi et al. | |
| 2006/0153045 A1 * | 7/2006 | Lee et al. | 369/112.27 |

OTHER PUBLICATIONS

"1st Office Action of China counterpart application", issued on Jun. 5, 2009, p. 1-p. 4.

* cited by examiner

*Primary Examiner* — Joseph Haley
(74) *Attorney, Agent, or Firm* — Jianq Chyun IP Office

(57) ABSTRACT

A micro optical head is provided, which provides sub-wavelength focusing spot and very long depth of focus. The optical head includes a transparent substrate, an opaque film, and at least one sub-wavelength annular channel. After coherent light transmits the transparent substrate supporting the optical head and passes through the appropriately designed sub-wavelength annular channel, the transmitted light can overcome the diffraction limit, and the transmission energy is improved efficiently. The transmitted light converges after a certain distance behind the optical head and forms a sub-wavelength-scale beam that maintains a very long distance without divergence.

23 Claims, 12 Drawing Sheets

OPTICAL HEAD

CROSS-REFERENCE TO RELATED APPLICATION

This application claims the priority benefit of Taiwan application serial no. 96120707, filed on Jun. 8, 2007. The entirety of the above-mentioned patent application is hereby incorporated by reference herein and made a part of this specification.

BACKGROUND OF THE INVENTION

1. Field of the Invention

The present invention relates to an optical head. More particularly, the present invention relates to a micro optical head capable of providing a sub-wavelength light spot and has an enough depth of focus.

2. Description of Related Art

To converge light beams smaller is a pursuing object for physicists. However, when a light beam is converged, the depth of focus is shortened, or the transmission energy is dramatically decreased, which greatly limits the development of photolithography and optical storage.

The size of a focusing spot of an optical lens is mainly restricted by the diffraction limit. As the wave characteristics of light include interference and diffraction, in a far field range, the size of the focusing spot of a lens is determined by the wavelength of incident light as well as the numerical aperture (NA) of the lens used. The depth of focus (DOF) of the lens is also affected by the wavelength and the NA. Theoretically, the size of the focusing spot cannot be smaller than $0.61\lambda$ ($\lambda$ is the wavelength of the incident light). Moreover, when the focusing spot is shrunk, the DOF is also reduced. In order to obtain a smaller light spot, a lens with a greater NA can be used in addition to shortening the wavelength. However, lens with larger NA will further reduces the DOF, and therefore, the requirements on the environment and the precision of platform control during exposure and etching become even stricter.

Currently, the known method for overcoming the diffraction limit is to utilize the principles of near field optics. That is, the exposure is performed within several tens of nanometers where no obvious diffraction occurs after light passes through a nanometer-scale optical hole, so as to obtain a light spot equivalent to the size of the hole. However, when the light passes through a hole smaller than its wavelength, the transmission is relative to the fourth power of the ratio of hole diameter to the wavelength $((d/\lambda)^4)$. It is known from the above that in order to obtain a sub-wavelength spot with the near field optical method, one of the limits is the intensity of the energy transmitting through the hole. The diffraction will be more serious for a smaller hole, and the size of the light spot will expand drastically when the distance to the hole becomes longer. Therefore, the distance of the sub-wavelength light spot to the hole is within several tens of nanometers, and the working distance must be controlled by a precise feedback mechanism.

In addition, Ebbesen et al. reported phenomenon of extraordinary optical transmission in 1998. That is, for incident light at specific wavelengths, the transmission through a silver film is extraordinarily increased. The wavelengths leading to the extraordinary transmission are about ten times greater than the diameter of the hole. The wavelengths leading to the extraordinary transmission are relative to the period and arrangement of the hole array, and the intensity of the transmission energy is relative to the depth-to-width ratio of the holes. Another key factor is the material of the metal film, and the extraordinary transmission phenomenon is only occurred for some specific metals.

In addition to metal sub-wavelength structures that may realize light beams with a smaller focusing spot and a longer DOF, a light beam referred to as Bessel beam also has the characteristics of non-divergence, that is, the DOF is infinite in theory. Scientists are trying different-experimental configuration to generate the Bessel beams. For example, a laser irradiates onto an annular mask placed at front focal plane of a lens, so as to form a Bessel beam in the region behind the lens. Alternatively, a laser irradiates onto a conical lens (Axicon) or a holographic element, will also generate a Bessel beam in the region behind the lens. However, the elements applied in the above methods still have sizes of conventional optical elements. Though micron-scale axicon are fabricated by E-beam lithography recently, the Bessel beam is still generated according to the traditional principle. For example, it is proposed that the annular mask is placed at the front focal plane of the lens to generate the Bessel beam without divergence. However, in actual implementations, a lens must be added behind the annular aperture, so the entire opto-mechanical system is hard to be miniaturized. Besides, other researchers use a single annular aperture as a mask, and the light passing through the mask interferes with another reference Gaussian beam to generate the Bessel beam. However, till now, the elements used in above methods are in the size of conventional optical elements (mm-cm).

As the conventional focusing lens and near field optical methods both have limitations in actual application, it is required to provide an optical head that is easy to fabricate and suitable for being miniaturized, and can generate a sub-wavelength focusing light spot with a very long DOF.

SUMMARY OF THE INVENTION

Accordingly, the present invention is directed to providing a micro optical head, which provides a sub-wavelength light spot and has an adequate depth of focus. The optical head is used to convert incident light to a sub-wavelength-scale light beam. The optical head includes a transparent substrate, an opaque film, and at least one sub-wavelength annular channel. The opaque film has a first surface and a second surface opposite to the first surface. The transparent substrate is attached on the first surface. The sub-wavelength annular channel is formed in the opaque film, and extends from the first surface to the second surface, such that the incident light traveling from the transparent substrate to the opaque film generates a surface plasmon on the opaque film.

The present invention is also directed to providing a photolithography device, which includes the optical head, and uses energy of the sub-wavelength-scale beam provided by the optical head to perform exposure and development on an object (e.g., a wafer). Moreover, the photolithography device can further include a movable platform, such that relative positions of the optical head to a photoresist layer have changes.

The present invention can generate Bessel beams having a sub-wavelength focal point and a longer depth of focus with a simple optical head structure.

In order to make the aforementioned and other objects, features and advantages of the present invention comprehensible, preferred embodiments accompanied with figures are described in detail below.

DESCRIPTION OF EMBODIMENTS

The present invention provides a micro optical head that uses a sub-wavelength annular aperture to generate Bessel beams based on concept of generating Bessel beams with localized modes. The micro optical head of the present invention is easy to fabricate, and is suitable for being miniaturized. Furthermore, the micro optical head proves the existence of the sub-wavelength focusing spot and the light beam maintains a very long depth of focus through experiments.

Figure 1:
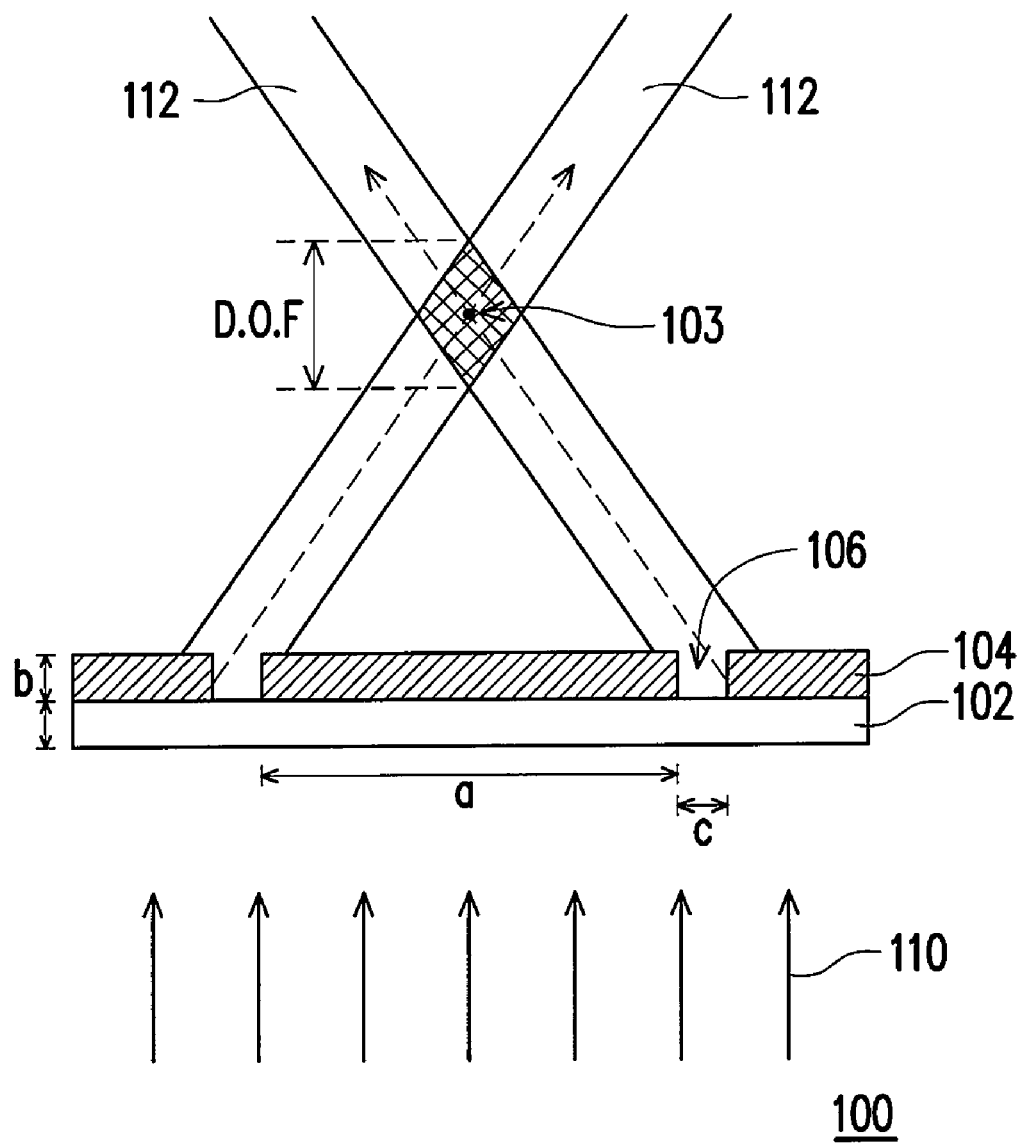
FIG. 1 is a schematic cross-sectional view of a micro optical head according to the present invention.
Figure 2:
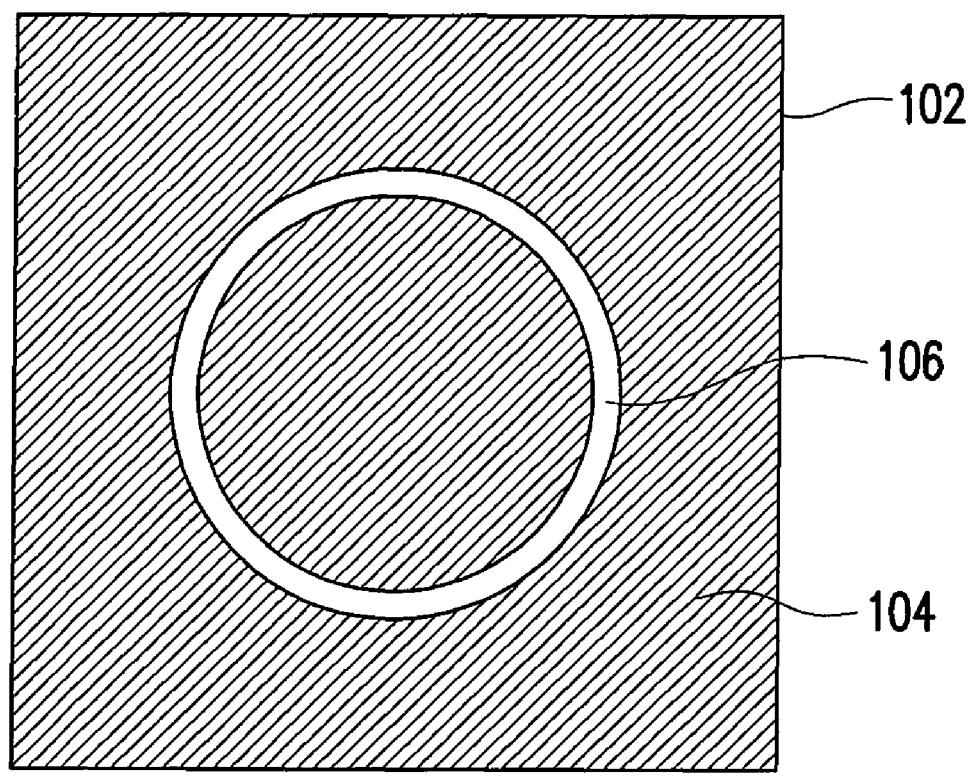
FIG. 2 is a top view of the micro optical head of FIG. 1.

FIG. 1 is a schematic cross-sectional view of the micro optical head according to the present invention, and FIG. 2 is a top view of the micro optical head of FIG. 1. As shown in FIGS. 1 and 2, the micro optical head 100 at least comprises a transparent substrate 102 and an opaque film 104. The opaque film 104 has a first surface and a second surface opposite to the first surface. The transparent substrate 102 is attached on the first surface. A sub-wavelength annular channel 106 is formed on the opaque film 104. The sub-wavelength annular channel 106 is formed in the film, and extends from the first surface to the second surface, such that incident light 110 traveling from the transparent substrate 102 to the opaque film 104 generates surface plasmon wave on the opaque film 104. Furthermore, the optical head 100 can further comprise a coherent light source (not shown) for generating the incident light 110.

In this example, the diameter of the sub-wavelength annular channel 106 is a, the thickness of the opaque film 104 is b, and the aperture size of the sub-wavelength annular channel 106 is c. In addition, though only one sub-wavelength annular channel 106 is shown in FIG. 1, a plurality of sub-wavelength annular channels can be formed on demand in practical applications.

As shown in FIG. 1, the diameter a of the sub-wavelength annular channel 106, the thickness b of the opaque film 104, and the aperture size c of the sub-wavelength annular channel 106 together determine the size of the smallest light spot generated by a focusing spot 103, the DOF, and the position of the focusing spot 103.

The transparent substrate 102 supports the opaque film 104, but does not block the incident light 110. The opaque film 104 prevents the incident light 110, such that the incident light 110 can hardly transmit the opaque film 104 directly, but passes through the sub-wavelength annular channel 106 in the film only. In a specific mode, the energy is released at the exit. The sub-wavelength annular channel 106 can modulate the transmission light 112, and the properties of the material of the opaque film 104 can control the mode of the light in the sub-wavelength annular aperture, such that most energy is evenly distributed in the sub-wavelength annular aperture. By adjusting the thickness b of the opaque film 104, the specific mode is formed in the sub-wavelength channel, so as to form a specific wave propagation angle in free space after the exit surface. The size of the focusing spot 103 generated by the optical head 100 is about ¾ wavelengths, and the DOF is up to several tens of wavelengths.

Then, the above parameters are explained as follows. One or more sub-wavelength annular channels 106 can be formed in the opaque film 104 of the optical head 100, so as to function as a sub-wavelength-scale light source. The propagation direction of each light emitted from the optical head 100 is determined by the thickness b of the opaque film 104, and the thickness b can be 0.25 to 2 times of the wavelength of the incident light. The thickness b of the opaque film 104 mainly has influences on the intensity of the transmission light field. As described above, its function is to prevent the incident light from directly transmitting therethrough. Therefore, the thickness b is not specially limited, as long as the function described above can be realized.

In addition, the diameter a of the sub-wavelength annular channel 106 has influences on the interception position of the emitting light. When the diameter a of the sub-wavelength annular channel 106 is greater, the interception position of the incident light is farther. However, the diameter a does not influence whether the directional beaming mechanism occurs or not. Taking the experiment results as an example, when the radius (a/2) of the sub-wavelength annular channel 106 is 10 to 30 times of the wavelength of the incident light, the sub-wavelength focusing spot can be generated effectively. However, the fabrication size is not limited to the above description.

The diameter a of the sub-wavelength annular channel 106 also influences the focal position 103 and the DOF of the optical head 100. When the diameter a of the sub-wavelength annular channel 106 is greater, the light spot where the emitting light beams intercept has a longer DOF (the position where the emitting light beams intercept in FIG. 1). Generally speaking, the diameter a can be fabricated to a size of 10-30 times of the wavelength of the incident light, but is not limited to the above range.

In addition, the material of the opaque film 104 of the optical head 100, i.e., the relative dielectric constant, will influence the mode and energy distribution in the sub-wavelength annular channel. For example, a silver annular channel is mainly worked at $HE_{11}$ mode (the mixed mode of TM and TE) due to the excitation of cylindrical surface plasmon mode, and a tungsten annular channel is mainly worked at $TE_{11}$ mode. For example, the opaque film 104 of the optical head 100 can be of a metal material (a material with a relative dielectric constant between −2 and −32), or a non-metal material (a material with a relative dielectric constant between +1.5 and +16).

In addition, the width c of the sub-wavelength annular channel 106 of the optical head 100 can be in a size of 0.05 to 0.95 times of the wavelength of the incident light.

Furthermore, an annular surface structure, e.g., a circular groove (see FIGS. 12 and 13), can be fabricated on the opaque film 104 of the optical head 100 to further enhance the energy of the focusing spot. The circular groove must be deep enough to influence the phase of the scattering light, and the depth must be in a size of 0.05 to 0.5 times of the wavelength of the incident light.

Silver SAA structure is taken as an example to illustrate near field and far field optical properties of optical head of this embodiment and related characteristics of the focusing spot are detailed.

Firstly, in order to fabricate the optical head, for example, a sputtering machine is used to coat a silver film with a thickness of 250 nm (equivalent to the opaque film 104) on a clean glass substrate (equivalent to the transparent substrate 102). Then, a focused ion beam (FIB) system is used to mill a sub-wavelength annular aperture (SAA) structure with a line width of 150 nm and a diameter of 12 μm on the metal surface formed by the silver film. The above dimensions are only for the convenience of the illustration below, and are not limited to be so in actual implementations. The film having the SAA structure and fabricated with the silver material is referred to as an SAA specimen below.

Near Field Optical Properties

Figure 3:
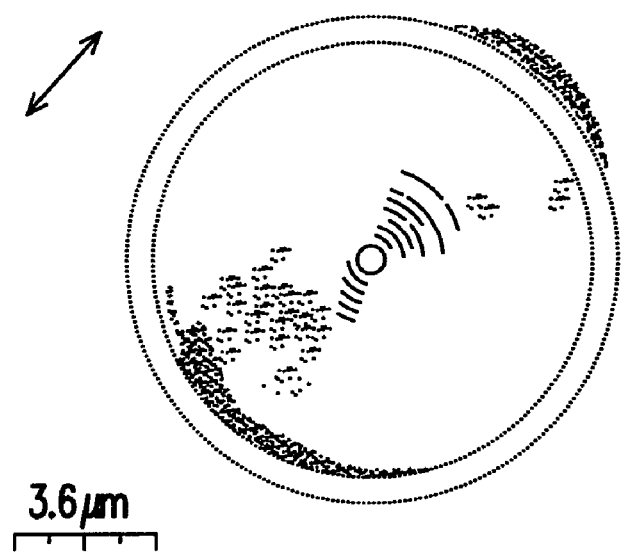
FIG. 3 shows the results of near field optical measurement of the SAA structure, and the polarization direction of the incident light is shown as the arrow direction in the figure.

In order to discuss the near field optical properties, a linear polarized He—Ne laser with a wavelength of 633 nm is incident onto the fabricated silver SAA specimen in a normal direction (perpendicularly), and a commercial near field optical microscope is used to perform a collection mode scanning. The result is as shown in FIG. 3, and a light spot is found at the center of the sub-wavelength annular channel. Measuring the period of the interference fringes, we obtain the period is about 307 nm. The wavelength of the surface plasmon generated at the interface between the silver and the air can be calculated according to Equation (1) below, and the theoretical value of the surface plasmon wavelength is 612 nm (where $\lambda_{sp}$ is the wavelength of the surface plasmon, $\lambda$ is the wavelength of the incident light, $\in_m$ is the dielectric constant of the metal, $\in_d$ is the dielectric constant of the dielectric interface, and $k_{sp}$ is the wave vector of the surface plasmon). The interference fringe (307 nm) is about one half of the wavelength of the surface plasmon (612 nm). Thus, it is known that the light spot is generated by the interference of the surface plasmon wave generated by the sub-wavelength annular aperture after transmitted to a center of the annular aperture.

$$\lambda_{sp} = \frac{2\pi}{k_{sp}} \quad (1)$$

$$= \frac{2\pi}{\frac{2\pi}{\lambda}\sqrt{\frac{\varepsilon_m \times \varepsilon_d}{\varepsilon_m + \varepsilon_d}}}$$

$$= \lambda\sqrt{\frac{\varepsilon_m + \varepsilon_d}{\varepsilon_m \times \varepsilon_d}}$$

$$= 633\,(\text{nm}) \cdot \sqrt{\frac{-16+1}{-16\times 1}} \sim 612\,(\text{nm})$$

Figure 4:
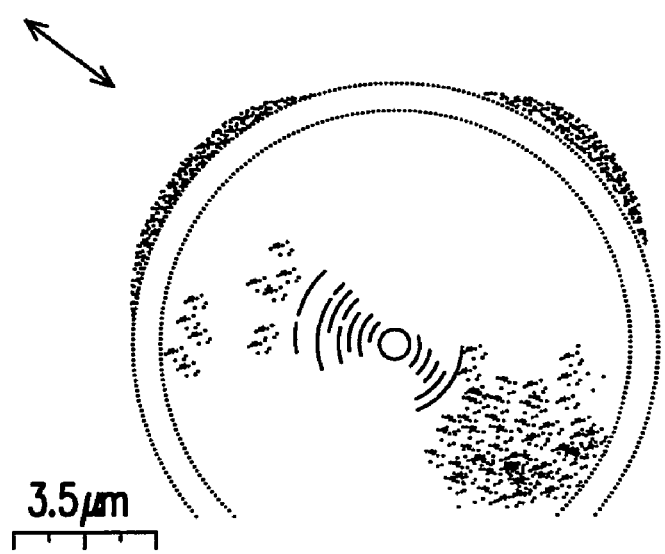
FIG. 4 shows the results of near field optical measurement of the SAA structure, and the polarization direction of the incident light rotated by 90 degrees is shown as the arrow direction in the figure.

As only the TM wave can excite the surface plasmon, the change of the polarization direction of the incident light theoretically influences the direction of the interference fringes. When the polarization direction of the incident light is rotated by 90 degrees, the measurement result is shown in FIG. 4, in which the arrow direction is the polarization direction of the incident light. It is known from the result that when the polarization direction of incident light is rotated by 90 degrees, the interference fringes of surface plasmon will also be rotated by 90 degrees. Thus, it is proved that the light spot at the center of the silver SAA specimen is formed by the interference of the surface plasmon.

Figure 5:
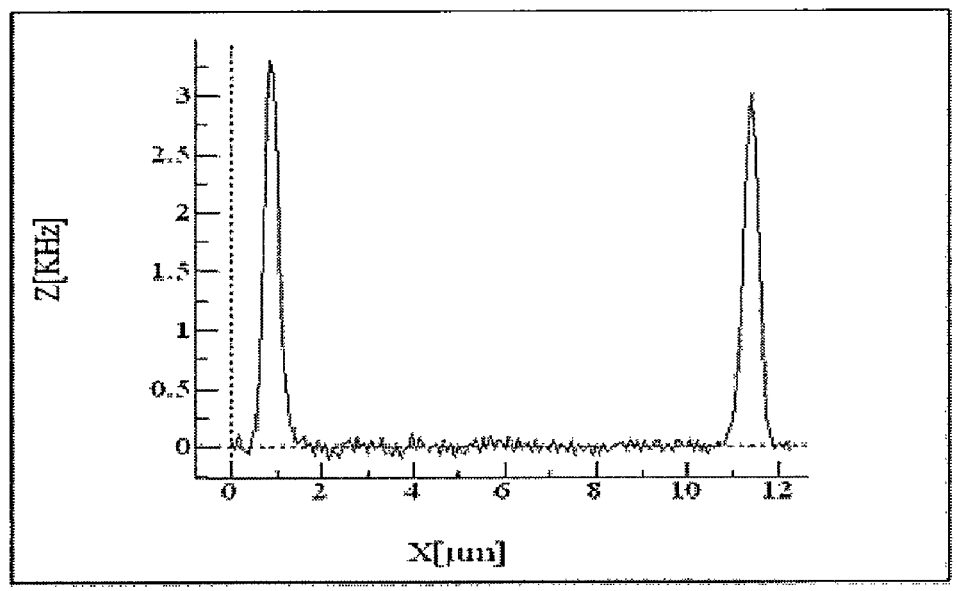
FIG. 5 shows the results of near field optical measurement of the SAA structure, in which the wavelength of the incident light is 442 nm, and in the center of the ring, there is no surface plasmon.

Then, the incident light source is changed to a He—Cd laser with wavelength of 442 nm, and the near field measurement results are shown in FIG. 5. It is obviously known from FIG. 5 that the center of the annular channel does not have the focusing spot when the incident light of this wavelength is used. By examining of the material parameters of the metal in the visible light band carefully and taking the parameters into Equation (2) below, the propagation length of the surface plasmon is calculated as follow (where $L_{sp}$ is the propagation length of the surface plasmon, $k_{sp,I}$ is the imaginary part of the wave vector of the surface plasmon, $\omega$ is the frequency of the incident light, c is the speed of light in vacuum, $\in_{m,R}$ is the real part of the dielectric constant of the metal, $\in_{m,I}$ is the imaginary part of the dielectric constant of the metal, and $\in_d$ is the dielectric constant of the dielectric interface).

$$L_{sp} = \frac{1}{2(k_{sp,I})}; \text{ where } k_{sp,I} = \frac{\omega}{c}\left(\frac{\varepsilon_{m,R}\cdot\varepsilon_d}{\varepsilon_{m,R}+\varepsilon_d}\right)^{3/2}\cdot\frac{\varepsilon_{m,I}}{2(\varepsilon_{m,R})^2} \quad (2)$$

Figure 6:
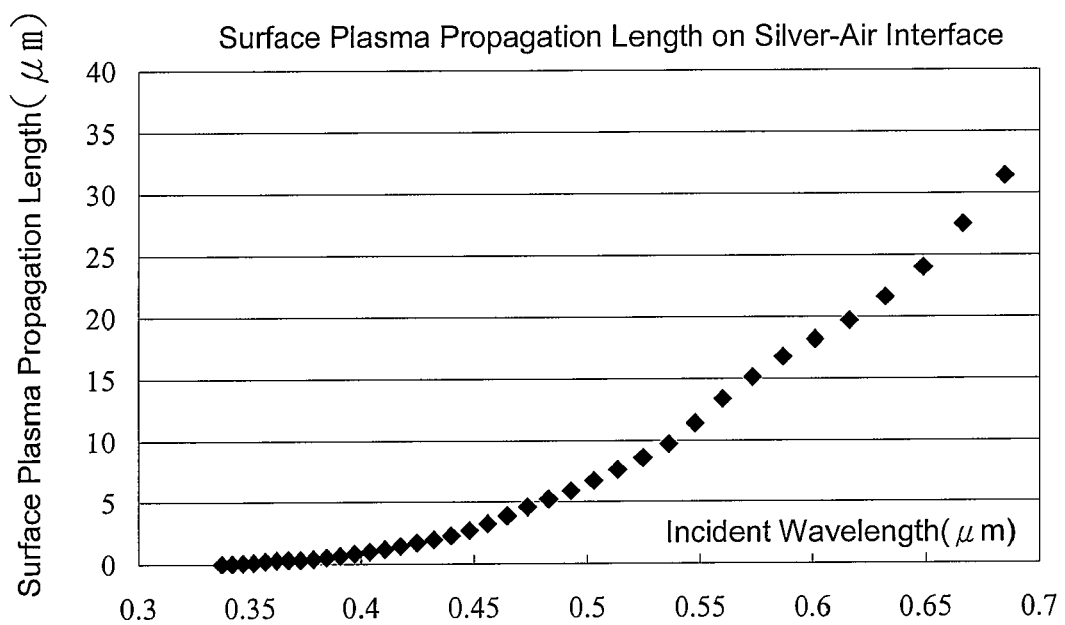
FIG. 6 shows the propagation length of the surface plasmon on a silver-air interface under different incident wavelength.

The calculation results are shown in FIG. 6. It is known from FIG. 6 that when the wavelength of the incident light is 442 nm and 633 nm respectively, the transmission length of the surface plasmon on the silver-air interface is 2.3 μm and 21.6 μm respectively. Compared with the annular aperture with a radius of 6 μm used in the experiment, the transmission length of the surface plasmon wave excited by the incident light with a wavelength of 442 nm is too short, and the energy transmitted to the center of the annular channel is too weak, so the signal is hidden in the background noise of the detector and can not be detected. It is known from the above that the metal material must match with an appropriate wavelength of the incident light, such that the excited surface plasmon wave has an enough propagation length.

Far Field Optical Characteristics

The above discussion proves that for an appropriate incident wavelength (e.g., 633 nm), the silver SAA specimen will generate a light spot of surface plasmon interference at the center of the surface of the annular aperture. The light spot can function as a bridge for energy conversion between the far field light and other surface optical elements. In order to better understand the far field characteristics of the silver SAA specimen, a laser with a wavelength of 442 nm is normally incident onto the SAA structure, and the focal plane of the object lens of the microscope is moved to observe the light field distribution of the transmitted light at different heights.

Figure 7:
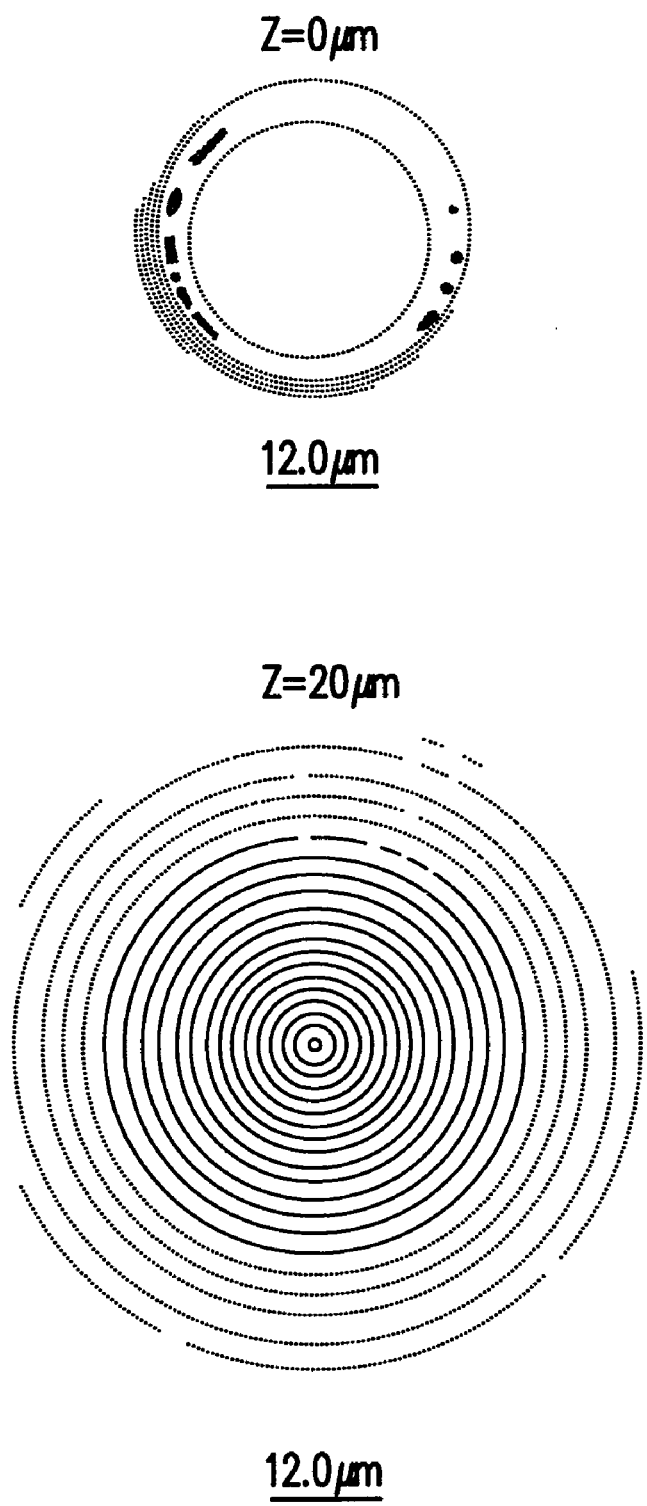
FIG. 7 shows the results of far field optical measurement of the SAA structure, in which the first image is the transmission optical image at exit surface of the sub-wavelength annular channel, and the second image is the focusing spot generated at a distance about 20 μm above the surface.

As shown in FIG. 7, a focusing spot is formed at a height of about 20 μm, which maintains several tens of μm without divergence. Therefore, the focal beam possesses properties of Bessel beams. Currently, only the methods described in the prior art are used to generate the Bessel beams, and the method that uses a simple structure of a sub-wavelength annular channel (a silver annular channel in this example) to generate the Bessel beam has not been developed. In order to further perform a quantitative analysis on the beam, the near field optical microscope is used in the collection mode, and the voltage of a piezoelectric stage is controlled to enable the fiber probe scanning at different heights. The obtained images are shown in FIG. 8.

Figure 8:
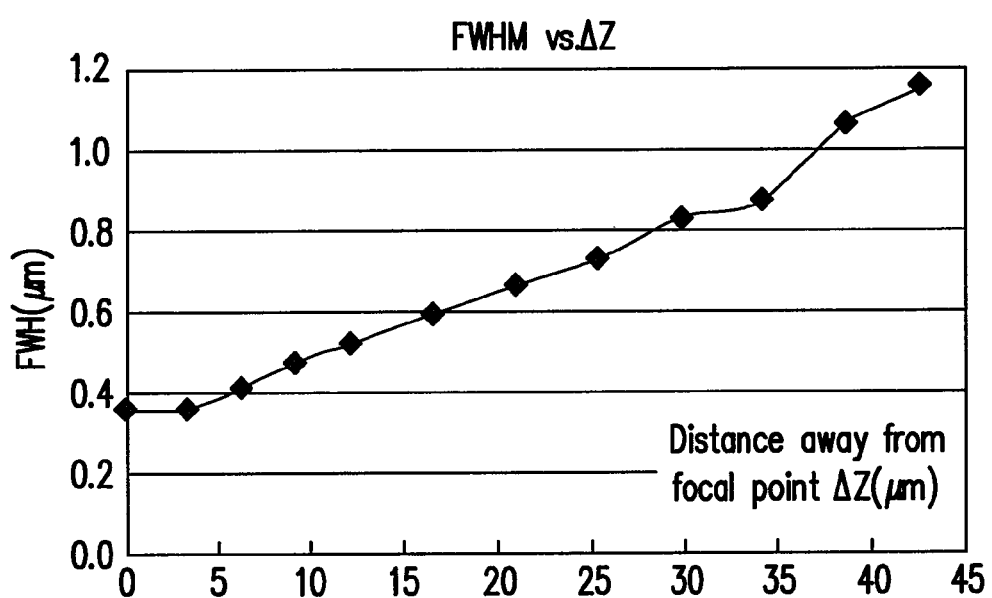
FIG. 8 is the relationship of far field focusing spot sizes to the distance away from the focal point.
Figure 9:
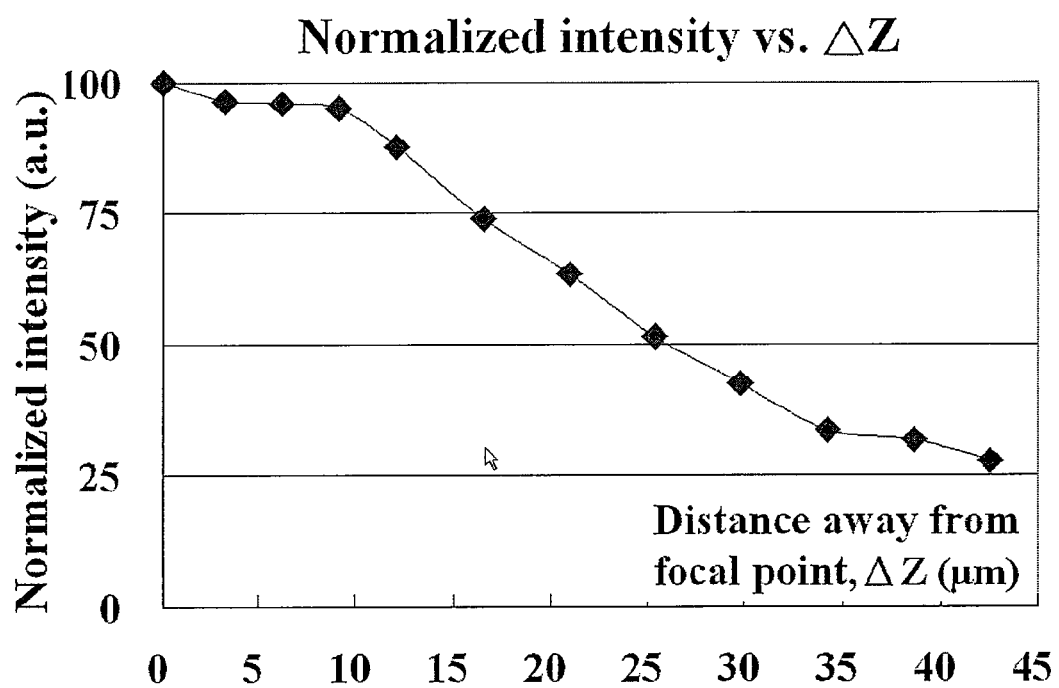
FIG. 9 is a relationship diagram of the intensities of far field light spots to the distance away from the focal point.

As shown in FIG. 8, the smallest focusing spot is 354 nm, and the size of the light spot maintains below 1 μm at a distance of 42.6 μm away from the focal point. The change of the focal point intensity away from focal point is shown in FIG. 9. It is known from FIG. 9 that a half of the DOF is about 25 μm (the DOF is 50 μm (113λ)). Compared with focusing spot with a conventional lens (Gaussian beam), in order to obtain the same focal spot, a lens with a numerical aperture equals to 0.75 must be used. However, under this condition, ($\mu m^{-1}$), and the emitting light is transmitted to the air, so the wave vector of the emitting light $k=2\pi n/\lambda=14.22$ ($\mu m^{-1}$). It is known from the above that the emitting angle $\theta=\sin^{-1}$ ($k_z/k$). Considering the fundamental mode (m=1), it can be calculated that the emitting angle is 62 degrees in this case. Comparing with the experimental results of Table 1 (63-66 degrees), it is found that the emitting light has fine consistence.

The reason that the silver SAA structure can generate Bessel beams is explained as follows. In the silver SAA structure, the symmetry of the annular channels and the localized modes inside the channels make the emitting light from the annular channels to generate serials of plane waves lying on the surface of a cone (conical wave vector), which is an essential condition to generate Bessel beams.

TABLE 1

| Diameter (μm) | Size of Focal Spot (FWHM) (nm) | Focal Length (μm) | $F_1$ (μm) | $F_2$ (μm) | Emitting Angle (θ, °) | $\theta_1$ (°) | $\theta_2$ (°) | Δθ | DOF ($F_2 - F_1$) (μm) |
|---|---|---|---|---|---|---|---|---|---|
| 6 | 474 | 6 | 3 | 17 | 63.43 | 45.00 | 79.99 | 34.99 | 14 |
| 9 | 426 | 10 | 5 | 26 | 65.77 | 48.01 | 80.18 | 32.17 | 21 |
| 12 | 466 | 14 | 6 | 37 | 66.80 | 45.00 | 80.79 | 35.79 | 31 | the DOF is only 2.26 μm (5.1λ). Comparing the above two methods, it is known that the focusing spot of the silver SAA structure has an extraordinary large DOF, i.e., possesses the properties of Bessel beams.

Figure 10:
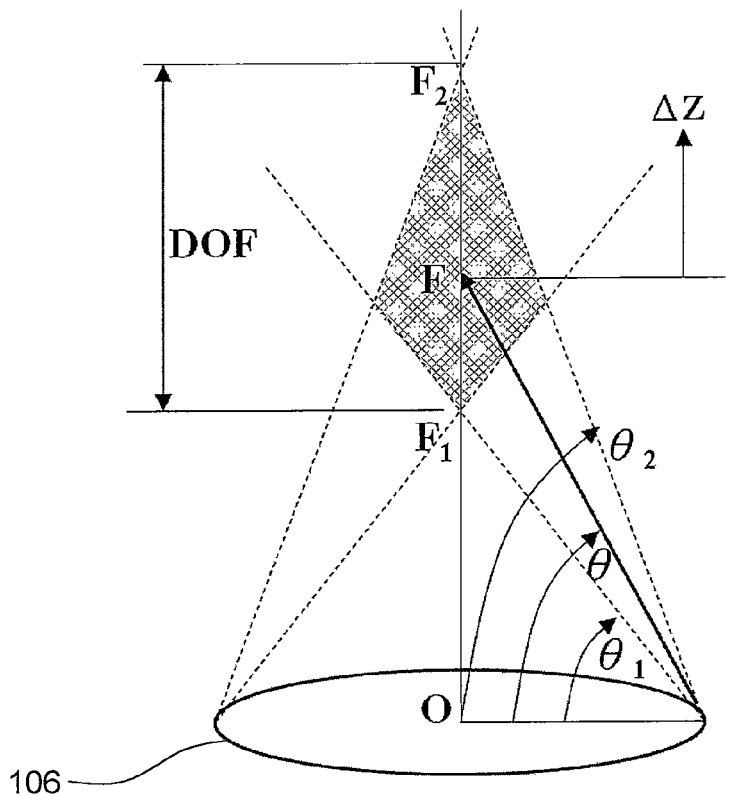
FIG. 10 is a schematic diagram of the Sub-wavelength Annular Aperture (SAA) structure, the angle of transmitted light, the distance (position) of the focal point, and the DOF.

Next, the mechanism for generating Bessel beams with the optical head of this embodiment is described in more detail. FIG. 10 is a schematic relationship diagram of the SAA structure. The angle of transmitted light, the distance (position) of the focal point, and the DOF are indicated in the figure. Three sub-wavelength annular apertures with different diameters of 6 μm, 9 μm, and 12 μm respectively are fabricated on the same silver film (thickness~250 μm). A linear polarized laser with a wavelength of 442 nm is normally incident onto the fabricated SAA structures, and several important parameters are measured in the far field. As shown in FIG. 10, F is the position of focal point with the highest energy, $F_1$ and $F_2$ are positions where the energy is one half of the focal point, the DOF is the distance between $F_1$ and $F_2$, and $\theta_1$, $\theta$, and $\theta_2$ are emitting angles corresponding to $F_1$, F, and $F_2$ respectively. The results of the experiments are as listed in Table 1. It is known from the results that the focusing spot is approximately the same as the incident wavelength, and the position of the focal point (F) is in direct proportion to the diameter (D) of the sub-wavelength annular channel 106. Moreover, for the SAA specimen with a same film thickness, the emitting angles ($\theta_1$, $\theta$, and $\theta_2$) are close to one another when the diameters of the three sub-wavelength annular channels 106 are changed.

Figure 11:
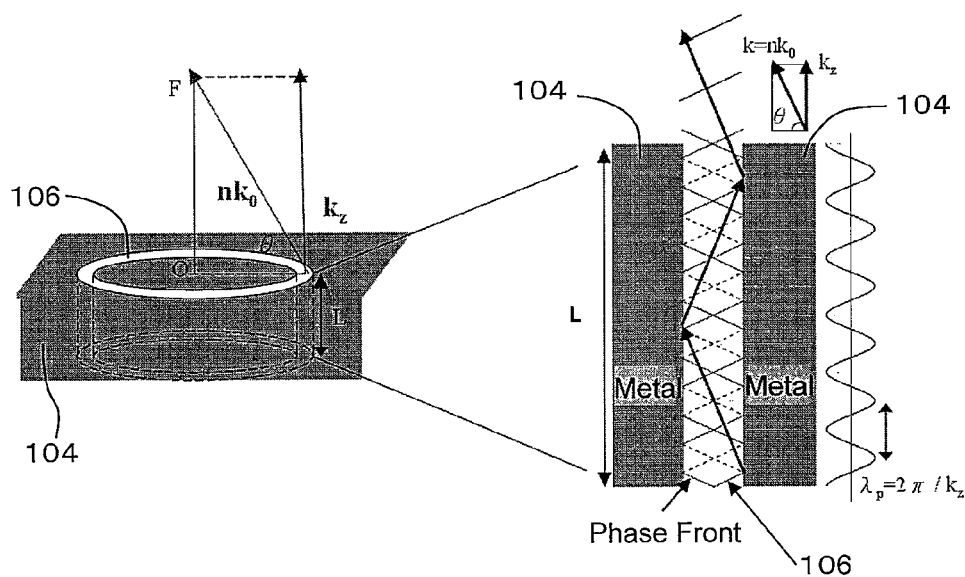
FIG. 11 is a schematic view of a vertical resonant cavity of SAA structure on the opaque film.
Figure 12:
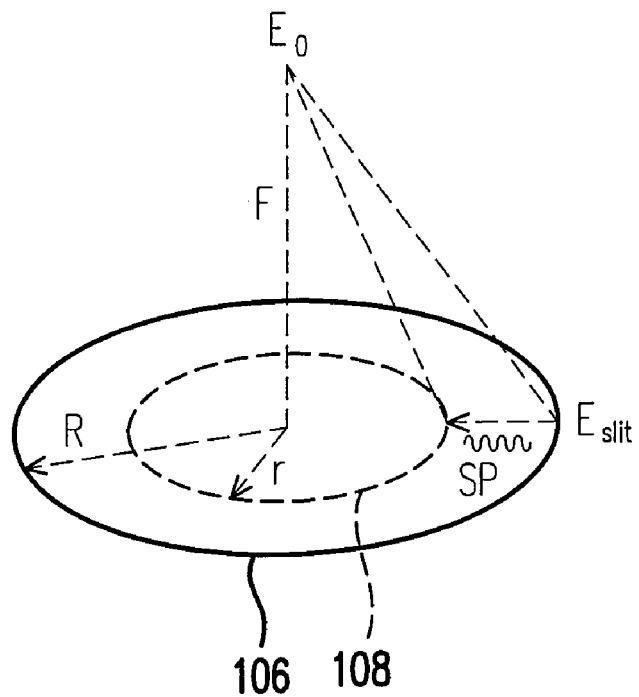
FIG. 12 is a schematic view of a wave propagation model of a SAA structure with a groove.

The consistence of the emitting angles explains the concept of directional properties with the model shown in FIG. 11. FIG. 11 is a schematic view of a wave propagation model of a SAA structure. When the surface plasmon transmitted in the sub-wavelength annular channel 106 satisfies the equation $k_zL=m\pi$, an cylindrical surface plasmon (CSP) can be excited in the sub-wavelength annular channel, where a stable mode (CSP mode) will be formed within the limited length L of the sub-wavelength annular channel 106 (i.e., In this case, the channel length equals to the thickness b of the opaque film in FIG. 1). Moreover, a specific mode in a waveguide is corresponding to a specific wave propagation angle in free space. In our experiments, $k_z=m\pi/L=m\pi/0.25$ ($\mu m$)=12.56 m FIG. 12 is a schematic view of an alternation to the structure of the optical head of FIG. 1. FIG. 11 is a schematic sectional view of an opaque film having a circular groove and a sub-wavelength annular channel. The difference between the structures of FIG. 12 and FIG. 1 lies in that a circular groove 108 (shown as the dotted lines) is further formed in the inner side of the sub-wavelength annular channel 106. FIG. 12 only shows the component that is different from FIG. 1, and other identical structures are omitted. The optical head structure of FIG. 12 can further enhance the energy of the focusing spot. It is known from the above description that when the light passes through the annular channel structure 106, the emitting light will have a phenomenon similar to Bessel beams, such that the emitting light has a sub-wavelength focusing spot in the far field, and a very long depth of focus.

FIG. 12 shows a nanometer metal structure named ring containing circular groove (RCG), which makes the incident light generates transmitted surface plasmon when passing through a single annular channel 106, and the circular groove 108 at the surface couples the surface plasmon to form the light, which is scattered to the far field to enhance the emitting energy. Here, the radius of the sub-wavelength annular channel 106 is R, and the radius of the circular groove 108 is r.

As shown in FIG. 12, after passing through the sub-wavelength annular channel 106, the transmitting energy is separated into two parts. One is directly transmitted to the far field, and the other is the surface plasmon propagated on the metal surface. If a circular groove is fabricated near a slit of the annular aperture, the surface plasmon will be scattered to the far field, so as to enhance the focal energy.

Equation (3) below is an equation representing the result of adding the scattered light of the circular groove 108 and the directly transmitted light. The RCG structure is designed according to the interference of the surface plasmon scattered light with the directly transmitted light from the annular channel 106. In Equation (3), $L_{sp}$ is the propagation length of the surface plasmon on the metal surface. $\Delta_1$ and $\Delta_3$ are phase changes caused by the directly transmitted light from the annular channel 106 and the surface plasmon scattered light when propagating in the air, which equal to $2\pi\sqrt{R^2+F^2}/\lambda_{air}$ and $2\pi\sqrt{r^2+F^2}/\lambda_{air}$ respectively. $\Delta_2$ is the phase difference when the surface plasmon is propagated on the metal surface, which equals to $2\lambda|R-r|/\lambda_{sp}$. $\lambda_{sp}$ is the wavelength of the surface plasmon propagated on the metal surface. $\Delta_g$ and $\beta$ are the phase difference generated when the surface plasmon is scattered by the groove and the scattering intensity respectively. As the surface plasmon propagated on the metal surface after the light passing through the sub-wavelength annular channel 106 is in the form of cylindrical wave, the decreasing form $1/\sqrt{x}$ when the cylindrical wave is propagated is introduced into Equation (3), where x is the propagation length.

Figure 13:
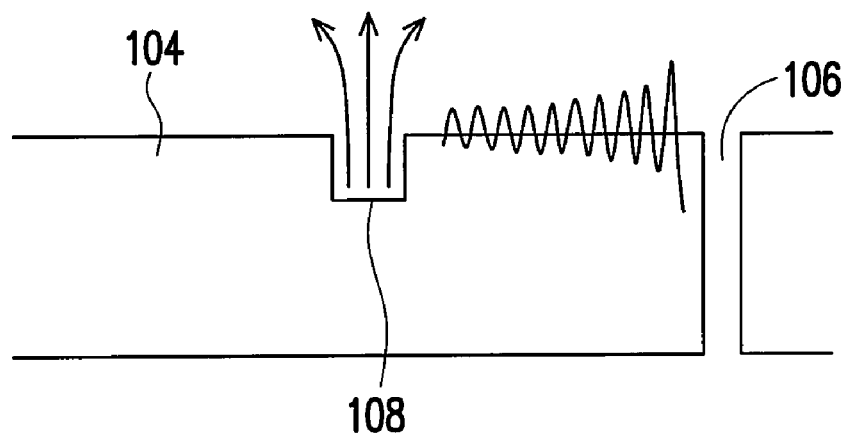
FIG. 13 is a schematic sectional view of an opaque film having a circular groove and a sub-wavelength annular channel.

Equation (4) shows the result of normalizing the emitting energy of the light from the RCG structure with the emitting energy of the light from a single sub-wavelength annular channel. It is known from Equation (4) that when the radius r of the circular groove 108 changes, the emitting energy of the RCG is modulated. Assuming that the size of the circular groove 108 can be adjusted appropriately, such that the interference between two beams is constructive, the emitting light of the RCG structure can have the maximum energy. As for $\Delta_g$, the circular groove 108 can be regarded as a vertical resonant cavity. As shown in FIG. 13, when the surface plasmon is transmitted to the groove, the depth of the circular groove 108 is h, and the circular groove 108 is a vertical resonant cavity. Therefore, after the light is scattered, the phase difference is $2\pi h/\lambda_{sp}$.

$$E_0 = E_{ring} + E_{scattering} \quad (3)$$
$$= 2\int_0^\pi E_{slit}f(\theta)Re^{-i\Delta_1}d\theta + 2\int_0^\pi \pm$$
$$\frac{\beta}{\sqrt{|R-r|}}E_{slit}f(\theta)e^{-i(\Delta_2+\Delta_3\pm\Delta_g)}e^{-\frac{|R-r|}{2L_{sp}}}rd\theta$$

$$\frac{I_0}{I_{ring}} = \frac{|E_0|^2}{|E_{ring}|^2} \quad (4)$$
$$= \left(1 \pm \frac{2\beta e^{-\frac{|R-r|}{2L_{sp}}}\cos(-\Delta_1+\Delta_2\pm\Delta_g+\Delta_3)}{\sqrt{|R-r|}}\frac{r}{R} + \frac{\beta^2 e^{-\frac{|R-r|}{L_{sp}}}}{|R-r|}\frac{r^2}{R^2}\right)$$

Figure 14:
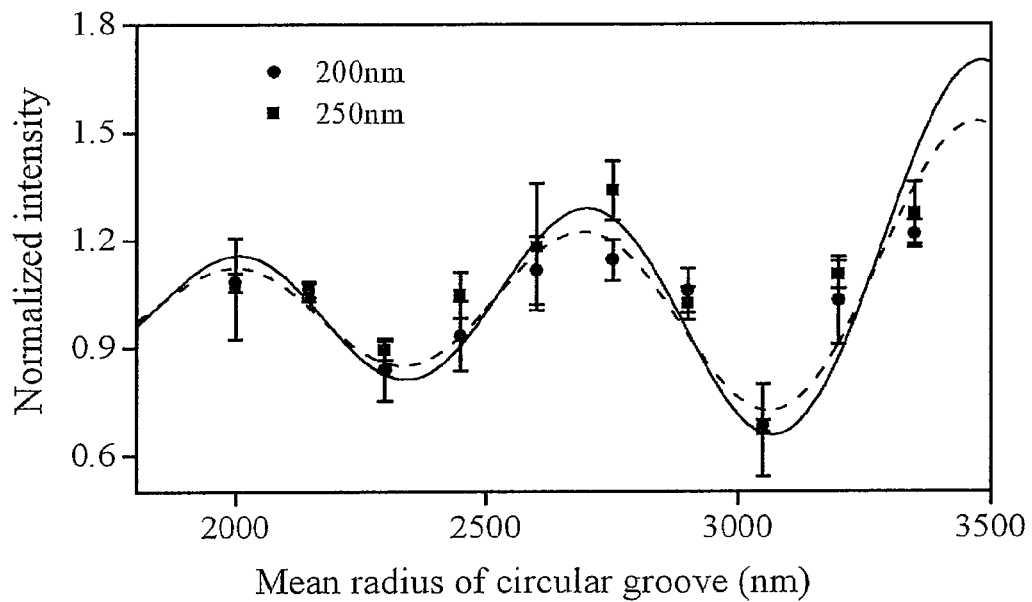
FIG. 14 shows the experiment results of the circular grooves with different radii to the focal spot intensity.

In order to better understand the actual interference, the FIB is used to fabricate the RCG structure on the metal surface, and the laser with a wavelength of 532 nm is used as the light source. In the experiment, four circular grooves with different widths but the same depth are fabricated, and the interference between the scattered light and the directly transmitted light is observed. FIG. 14 shows the comparison between the experiment results and Equation (4). It can be seen that when the radius r of the circular groove 108 changes, the scattered light will interfere with the directly transmitted light. As the light emitted from the RCG structure is received at a fixed point in the experiment, it is known from FIG. 14 that the emergent energy has the phenomenon of modulation. In another aspect, it is known that when the radius r of the circular groove 108 changes, the focal of the RCG structure is also changed accordingly. Moreover, it is known from FIG. 14 that the emergent energy is increased by 20%-30% compared with the emergent energy when a single sub-wavelength annular channel is used.

Figure 15:
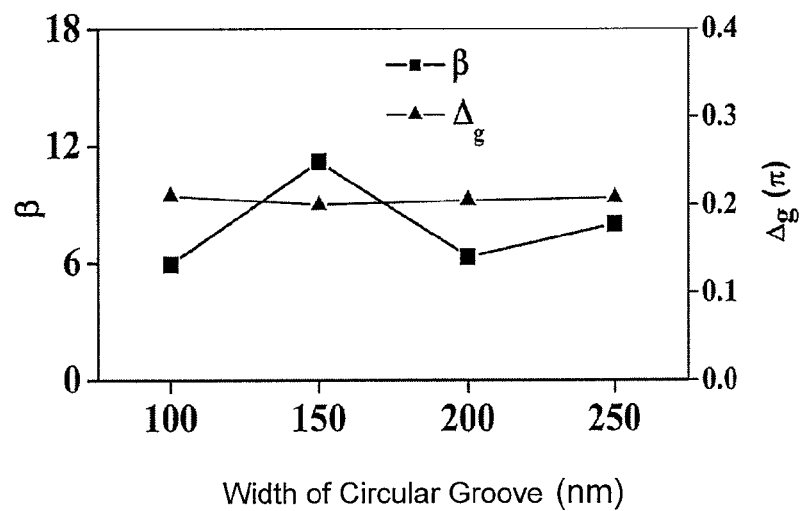
FIG. 15 shows the influence of circular grooves of different widths but the same depth to the scattering intensity and the scattering phase difference.

Moreover, FIG. 15 shows the influence of circular grooves of different widths but the same depth on the scattering intensity and the scattering phase difference. As for the scattering phase difference, when the laser with a wavelength of 532 nm is used, the wavelength of the surface plasmon excited by the incident light with the wavelength of 532 nm on the interface between air and metal is 505 nm. The depth of the fabricated circular groove is 55 nm. Therefore, the obtained scattering phase difference is $0.21\pi$, which is close to the experiment results. Moreover, the width of the circular groove does not influence the scattering phase greatly. Therefore, the phase difference can be changed by controlling the depth h of the circular groove. Thus, the emitting energy of the RCG structure is modulated.

Then, an example to implement the present invention is illustrated. The micro optical head of the present invention can be used in a wide range of applications requiring precise focusing or very long DOF. An example is given below to illustrate the present invention. However, the application of the present invention is not limited to the example below.

In the illustration of the above embodiment, a single sub-wavelength annular channel and a single circular groove are described for the convenience of illustration. However, in actual applications, optimum modifications can be made according to the theoretical description above. That is, the numbers of the sub-wavelength annular channel and the circular groove are not limited, and can be adjusted and matched appropriately.

Figure 16:
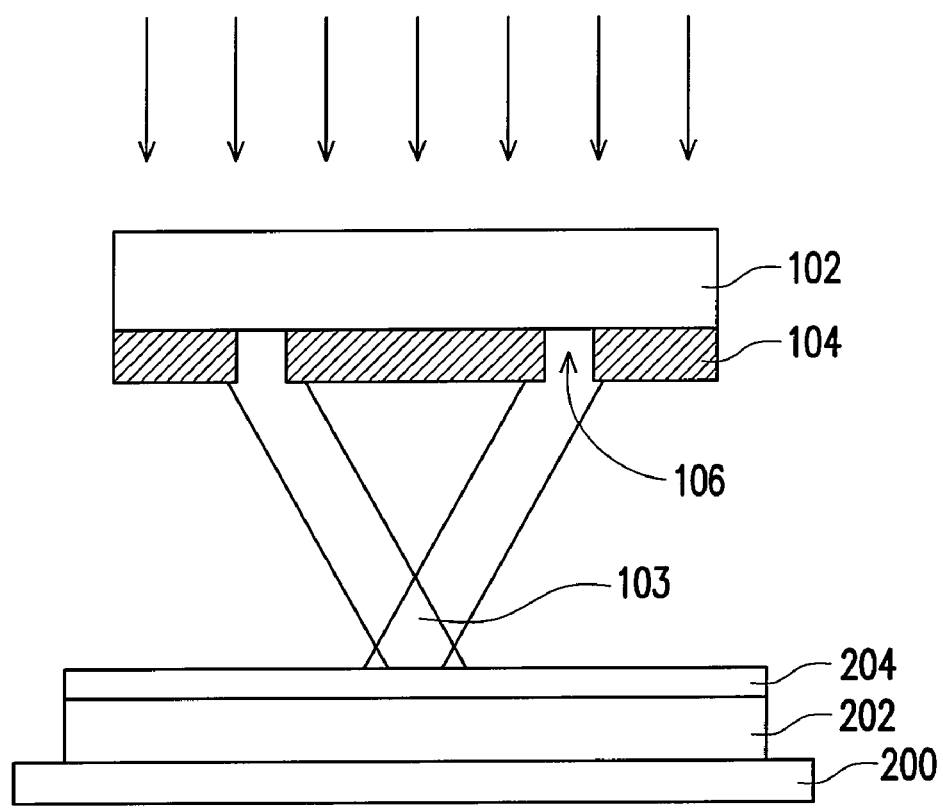
FIG. 16 is an example of applying the micro optical head of the present invention in photolithography.

FIG. 16 is an example of implementing the optical head in photolithography, which provides a focusing spot of a wavelength scale and having a very long DOF. As shown in FIG. 16, the incident light passes through the optical head (including the transparent substrate 102 and the opaque film 104). The optical head provides the focusing spot 103 of a sub-wavelength scale and having a very long DOF, which is focused on a photoresist 30 to perform exposure. Thus, patterns with a high depth-to-width ratio can be defined. 202 is a wafer that a pattern is to be transferred to. The pattern formed on a photoresist 204 by the optical head can be transferred onto the wafer 202 by means of dry etching and the like. 200 is a movable platform, which enables the wafer 202 thereon and the optical head to be at relative positions, so as to define the required patterns.

For example, the optical head can, but is not limited to, be applied in photolithography, optical storage, controlling small particle remotely with optical tweezers, and fabricating structures with a high depth-to-width ratio.

It will be apparent to persons of ordinary art in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An optical head, for converting an incident light to a sub-wavelength-scale beam, comprising:
   a transparent substrate;
   an opaque film, having a first surface and a second surface opposite to the first surface, wherein the transparent substrate is attached on the first surface; and
   at least one sub-wavelength annular channel, formed in the opaque film, and extending from the first surface to the second surface, such that the incident light traveling from the transparent substrate to the opaque film generates a surface plasmon wave on the opaque film, and
   at least one circular groove is formed in an inner side of the sub-wavelength annular channel in the opaque film, such that the surface plasmon is coupled to light by the circular groove.

2. The optical head as claimed in claim 1, wherein the sub-wavelength annular channel is an annular aperture structure.

3. The optical head as claimed in claim 1, wherein a width of the sub-wavelength annular structure is 0.05 to 0.95 times of a wavelength of the incident light.

4. The optical head as claimed in claim 1, wherein the sub-wavelength annular channel and the circular groove have a common center.

5. The optical head as claimed in claim 1, wherein the circular groove is an annular surface structure.

6. The optical head as claimed in claim 1, wherein a depth of the circular groove is 0.05 to 0.5 times of the wavelength of the incident light.

7. The optical head as claimed in claim 1, wherein a relative dielectric constant of the opaque film is between −2 and −32.

8. The optical head as claimed in claim 1, wherein a relative dielectric constant of the opaque film is between +1.5 and +16.

9. The optical head as claimed in claim 1, wherein a relative dielectric constant of the transparent substrate is between +1.5 and +16.

10. The optical head as claimed in claim 1, wherein a thickness of the opaque film is 0.25 to 2 times of the wavelength of the incident light.

11. The optical head as claimed in claim 1, further comprising a coherent light source for generating the incident light.

12. A photolithography device, comprising at least:
   an optical head, for converting an incident light to a sub-wavelength-scale beam, and using energy of the sub-wavelength-scale beam to perform exposure and development of an object, wherein the optical head further comprises:
      a transparent substrate;
      an opaque film, having a first surface and a second surface opposite to the first surface, wherein the transparent substrate is attached on the first surface; and
      at least one sub-wavelength annular channel, formed in the opaque film, and extending from the first surface to the second surface, such that the incident light traveling from the transparent substrate to the opaque film generates a surface plasmon on the opaque film, and
      at least one circular groove formed in an inner side of the sub-wavelength annular channel in the opaque film, such that the surface plasmon is coupled to light by the circular groove.

13. The photolithography device as claimed in claim 12, further comprising a movable platform, capable of changing relative positions of the optical head and a photoresist layer.

14. The photolithography device as claimed in claim 12, wherein the sub-wavelength annular channel is an annular aperture structure.

15. The photolithography device as claimed in claim 14, wherein a width of the sub-wavelength annular structure is 0.05 to 0.95 times of a wavelength of the incident light.

16. The photolithography device as claimed in claim 12, wherein the sub-wavelength annular channel and the circular groove have a common center.

17. The photolithography device as claimed in claim 12, wherein the circular groove is an annular surface structure.

18. The photolithography device as claimed in claim 12, wherein a depth of the circular groove is 0.05 to 0.5 times of the wavelength of the incident light.

19. The photolithography device as claimed in claim 12, wherein a relative dielectric constant of the opaque film is between −2 and −32.

20. The photolithography device as claimed in claim 12, wherein the relative dielectric constant of the opaque film is between +1.5 and +16.

21. The photolithography device as claimed in claim 12, wherein a relative dielectric constant of the transparent substrate is between +1.5 and +16.

22. The photolithography device as claimed in claim 12, wherein a thickness of the opaque film is 0.25 to 2 times of the wavelength of the incident light.

23. The photolithography device as claimed in claim 12, further comprising a coherent light source for generating the incident light.

* * * * *